United States Patent [19]

Dixon

[11] 4,027,256

[45] May 31, 1977

[54] LOW LEVEL BROADBAND LIMITER HAVING FERRITE ROD EXTENDING THROUGH DIELECTRIC RESONATORS

[75] Inventor: Samuel Dixon, Neptune, N.J.

[73] Assignee: The United States of America as represented by the Secretary of the Army, Washington, D.C.

[22] Filed: July 9, 1976

[21] Appl. No.: 703,714

[52] U.S. Cl. .............................. 333/17 L; 333/82 R
[51] Int. Cl.² ........................ H01P 1/22; H01P 5/00
[58] Field of Search ............. 333/17 L, 73 R, 73 C, 333/82 R

[56] References Cited

UNITED STATES PATENTS

| | | | |
|---|---|---|---|
| 3,131,366 | 4/1964 | Dixon, Jr. | 333/17 L |
| 3,426,299 | 2/1969 | Dixon, Jr. | 333/17 L |
| 3,500,256 | 3/1970 | Carter et al. | 333/17 L |
| 3,648,197 | 3/1972 | Siekanowicz | 333/17 L |

Primary Examiner—Paul L. Gensler
Attorney, Agent, or Firm—Nathan Edelberg; Daniel D. Sharp; Jeremiah G. Murray

[57] ABSTRACT

A wide-band ferrite limiter for operation in the microwave frequency range comprised of a plurality of intercoupled dielectric resonators having a long, thin ferrite rod passing through the longitudinal central axis of the dielectric resonant structure. Broadband operation is achieved by the proximity coupling of the dielectric resonators while the ferrite rod provides an optimized ferrite geometry which serves to increase the dynamic range and also to decrease the critical threshold field. A DC field of magnetization is additionally provided along the longitudinal central axis which with the availability of light-weight small rare earth magnets allows the limiter to be magnetized in such a fashion that a very compact device is achieved thereby.

11 Claims, 3 Drawing Figures

LOW LEVEL BROADBAND LIMITER HAVING FERRITE ROD EXTENDING THROUGH DIELECTRIC RESONATORS

The invention described herein may be manufactured and used by or for the Government for governmental purposes without the payment of any royalties thereon or therefor.

BACKGROUND OF THE INVENTION

This invention relates generally to apparatus for limiting radio frequency power and more particularly to apparatus for limiting microwave frequency power through the utilization of power absorbing ferrite material.

Ferrite power limiting devices utilizing the characteristic of subsidiary resonance are well known. One such device is taught in U.S. Patent 3,500,256 issued to P. S. Carter, et al. which additionally discloses the use of a series of dielectric resonators. This device, however, has an inherent problem in obtaining a large dynamic range, in excess of 20db, because of the use of small ferrite spheres disposed within each of the dielectric resonators. Accordingly, the ferrite volume necessary to limit RF signals over a broad power range is not available.

The coupled cavity transmission system using dielectric resonators of high dielectric constant can be tuned to form a structure which is adapted to increase the bandwidth capability; however, the reduction in volume from that of a metallic cavity raises the RF magnetic field, thus tending to lower the limiting level from that obtained in other prior art apparatus.

The principal disadvantage of conventional ferrite power limiters is their small dynamic range and their relatively high threshold powers. It is the purpose of the present invention, therefore, to provide a device which solves the present deficiencies and being adapted to selectively limit high level signals over a 15 – 30% frequency bandwidth which will accordingly allow the ferrite limiters to be efficiently applied to communications in electronic warfare systems.

SUMMARY OF THE INVENTION

It is an object of the present invention, therefore, to provide a wide-band filter limiter which functions as a frequency selective discriminator and signal stabilizer particularly adapted for RF communications and electronic warfare systems.

It is a further object of the present invention to provide a microwave device having a relatively flat response with negligible spike leakage which will operate over a relatively large dynamic range.

Still another object of the present invention is to provide a power limiting device utilizing an optimum ferrite geometry capable of limiting one or more specified frequencies within a wide band without the need for any mechanical tuning or having the requirement to separate out a narrow band of frequencies from the remainder of the band.

Briefly, the present invention comprises a microwave transmission structure having a plurality of dielectric resonators axially aligned within a low dielectric housing enveloped by an electrically conductive casing. A relatively long, thin ferrite rod traverses the central axis of the dielectric resonators together with an RF coupling loop located adjacent each end resonator to couple microwave power in and out of the limiter. Additionally, a DC magnet is provided to generate a biasing field which is coextensive with the ferrite rod aligned along the central longitudinal axis of the device.

DESCRIPTION OF THE PREFERRED EMBODIMENT

Ferrite has three non-linear physical characteristics that may be utilized for power limiting. These characteristics are known as premature decline of the main resonance, subsidiary resonance, and coincidence of the main resonance with the subsidiary resonance. The first and third of these characteristics are applicable to the devices that have relatively narrow bandwidth and have thresholds that are too high for broadband type of receiver apparatus. Generally, ferrite power limiter devices have been designed to utilize the subsidiary resonance characteristic because it offers broader frequency range and sharper frequency selectivity. This characteristic is particularly suited for electronic warfare, receivers and communications receivers that operate in the microwave region of the electromagnetic spectrum. In electronic warfare systems, the frequency selective property makes it possible to monitor a plurality of signals within the pass-band of the receiver and if one or more monitored signals exceeds the limiting threshold while others do not, the signals that exceed the threshold are limited to threshold level while the other signals are passed unaffected.

Figure 1:
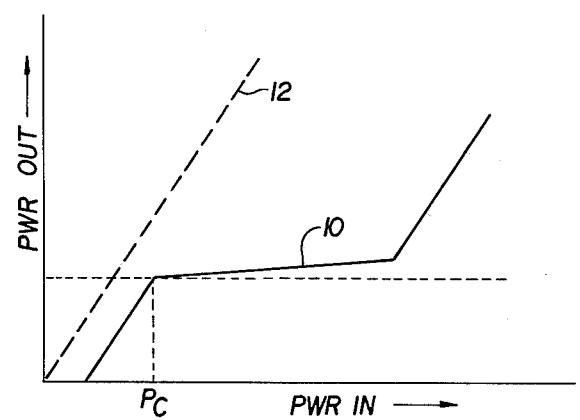
FIG. 1 is a graph depicting the operational characteristics of the subject invention.

Ferrite used for subsidiary resonance is crystalline, ferrimagnetic and nonconductive. Each molecule of the crystal has a magnetic moment. A DC magnetic field is established through the crystal in a direction such that the magnetic moments are aligned with the applied magnetic field. Microwave energy traversing the ferrite material causes the magnetic moments to precess relative to the magnetic field direction at a rate determined by the constituency of the material. Yttrium iron garnet is a typical material. The output is directly proportional to the input up to a critical threshold power. At the critical threshold power, spin waves are generated in the material and more of the incident microwave energy is absorbed. This non-linear action limits the microwave power output as microwave input power, at any frequency within the pass-band, increases from the threshold level. This characteristic is illustrated in FIG. 1, wherein the solid line curve 10 represents the output power as the input power increases while the dashed line 12 represents the power output in absence of a power limiter. It will be observed that the power output increases relatively little over the critical power $P_c$ for large increases in power input up to a point where breakdown of the device occurs. The separation between the curves 10 and 12 below the critical power $P_c$ indicates the insertion loss of the device.

Figure 2:
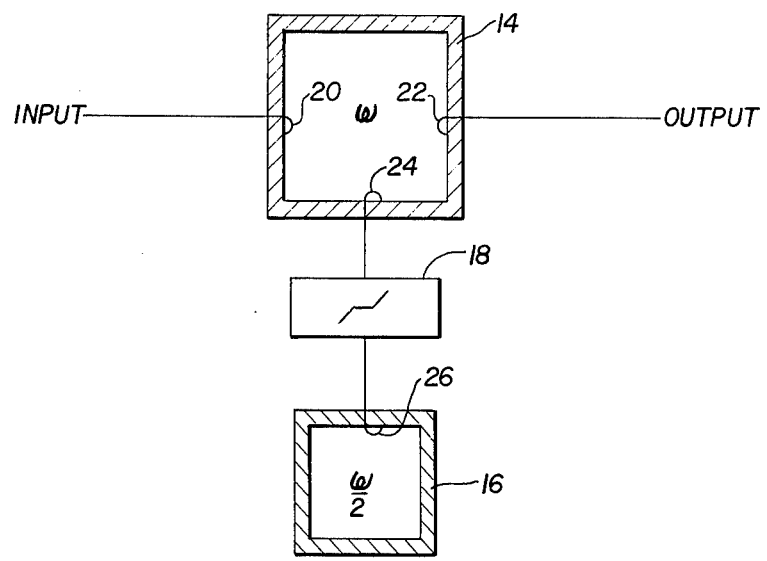
FIG. 2 is a schematic diagram helpful in understanding the operation of a subsidiary resonance limiter.
Figure 3:
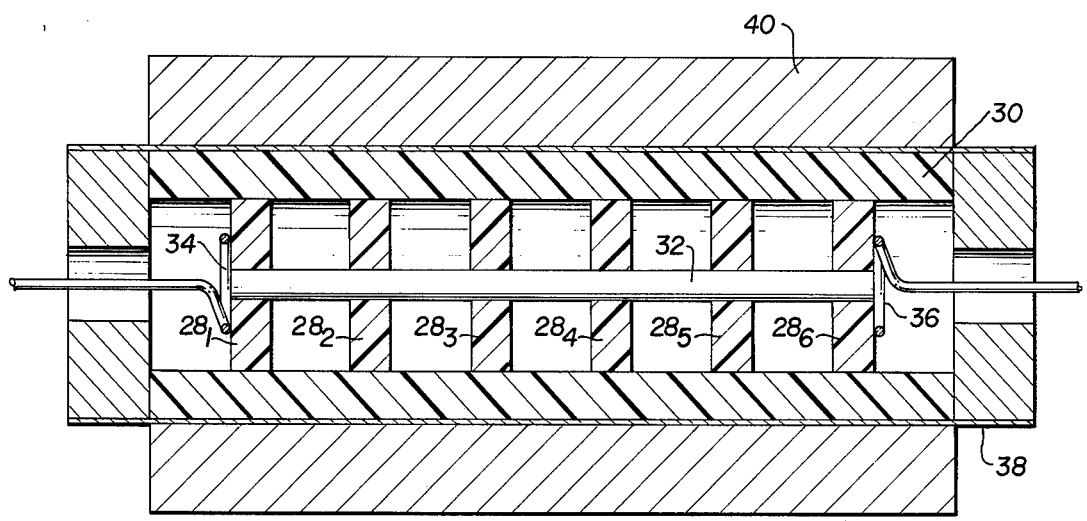
FIG. 3 is a central longitudinal cross section of the preferred embodiment of the subject invention.

When a power limiter operates in the subsidiary resonance mode, the action can be illustrated by reference to FIG. 2 wherein reference numerals 14 and 16 represent two resonant tank circuits, e.g. microwave cavities having respective resonant frequencies $\omega$ and $\omega/2$ coupled by a non-linear element 18. Input power is coupled to the ω tank circuit 14 via an input port 20 while output power is taken from an output port 22. A third port 24 couples to the non-linear element 18 which in turn is coupled to a common input-output port 26 of the tank circuit 16. When an input signal at frequency ω is below a certain power level, it will pass through the ω tank circuit 14 to the output port 22 as if the ω/2 tank circuit 16 were not present. However, when the input power is above the threshold power $P_c$ as illustrated in FIG. 1, oscillations will be excited at a frequency exactly half the input frequency, i.e. ω/2. The result is that part of the input power is transferred to maintain the subharmonic oscillations and part is reflected to the input source because of the impedance mismatch created by the tank circuit 16. These combined effects result in a sharp limiting characteristic as shown in FIG. 1. As the input power increases, subharmonic oscillations continue to increase but the output power remains substantially constant. This characteristic permits development of a frequency selective limiter consisting of a large bandwidth tank circuit having a resonant frequency ω and a series of subharmonic tank circuits coupled to the ω tank. The subharmonic tank circuits are tuned contiguously in frequency across the bandwidth to provide a frequency selective limiter. Consequently, limiting can be obtained on a frequency-by-frequency basis.

To this end, attention is now directed to the preferred embodiment of the subject invention wherein an optimum ferrite geometry is employed for enhancing the dynamic range of a microwave power limiter while decreasing the critical threshold power. More particularly, a plurality of high dielectric constant resonators $28_1, 28_2 \ldots 28_6$ are coaxially positioned within a cylindrical housing 30 comprised of low dielectric constant material. The dielectric resonators $28_1$ etc. form short tubular cylindrical stubs and may be comprised of such materials as rutile, strontium titanate and the like. A single relatively thin, long needle-like ferrite rod element 32 extends along the central longitudinal axis of the device traversing the center portion of all the resonators $28_1 \ldots 28_6$. The ferrite rod, moreover, has a plane of easy magnetization oriented parallel to the central longitudinal axis. An input coupling loop 34 is located adjacent the first resonator $28_1$, while an output coupling loop 36 is located adjacent the last resonator $28_6$. The coupling loops 34 and 36 are adapted to be coupled, for example, to microwave transmission line elements, not shown, such as the center conductor of a coaxial line. The assembly furthermore is contained within an electrically conductive outer casing which acts as an electrical shield as well as providing an electrical connection to the second conductor of the microwave transmission lines connected to the input and output loops 34 and 36. Exteriorly of the metal casing 38 is formed means for providing a direct current magnetic field along the longitudinal central axis of the device coextensive with the ferrite rod 32 and being of such a magnitude to bias the ferrite material contained in the ferrite rod 32 to a subsidiary resonance state. Such a means comprises a permanent magnet 40, for example, comprise of light-weight small rare earth material or any other suitable means well known in the art which is adapted to provide a small compact unit which is adapted to conform to the general shape of the device.

Thus what is shown in a device comprised of a chain of coupled dielectric resonators with a long, thin ferrite rod centrally located down the center of the structure. The multiple cavity structure acts as a high Q filter over a relatively wide bandwidth. The long, thin ferrite rod provides an optimum geometry for the ferrite element, since the active volume is increased to an optimum level so that the dynamic range of the device is significantly increased beyond present state of the art devices.

Having thus shown and described what is at present considered to be the preferred embodiment of the subject invention, it is to be understood, that this explanation has been made by way of example only, and is not meant to be interpreted in a limiting sense, since other forms and modifications may be resorted to without departing from the spirit and scope of the invention as set forth in the following claims.

I claim as my invention:

1. A microwave power limiter having a plurality of coupled dielectric resonators adapted to propagate power from an input end to an output end wherein the improvement comprises:
   a relatively long, thin ferrite rod element biased to subsidiary resonance extending between said plurality of resonators which thereby operates to increase the dynamic power range of the device as well as serving to decrease the critical threshold field at which power limiting occurs.

2. The power limiter as defined by claim 1 wherein said plurality of dielectric resonators are arranged in coaxial relationship and having a common central longitudinal axis and whereupon said ferrite rod element extends coextensively along said central longitudianal axis.

3. The power limiter as defined by claim 2 wherein said plurality of coaxial dielectric resonators are located in spaced relationship within a relatively low dielectric housing encompassed by an electrically conductive outer member which is adapted to confine power propagating within said limiter as well as shielding said resonators from stray electrical fields external to said limiter.

4. The limiter as defined by claim 3 and additionally including means for providing a direct current magnetic field coextensive with said ferrite rod along the central longitudinal axis.

5. The limiter as defined by claim 4 wherein said plurality of dielectric resonators are comprised of cylindrical members having a thickness which is of a lesser dimension than their diameter.

6. The limiter as defined by claim 5 wherein said plurality of resonators are substantially equally spaced.

7. The limiter as defined by claim 4 wherein the limiter is substantially circular in cross section in a plane transverse to said central longitudinal axis.

8. The limiter as defined by claim 4 wherein said ferrite rod element has a plane of easy magnetization oriented parallel to the direction of the biasing magnetic field extending along the central longitudinal axis.

9. The limiter as defined by claim 4 and additionally including a coupling loop formed adjacent one of said dielectric resonators at the input end for coupling power into the limiter and a coupling loop formed adjacent one of said dielectric resonators at the output end for coupling power from said limiter.

10. The limiter as defined by claim 4 wherein said plurality of dielectric resonators have a substantially equal cross sectional dimension in a plane transverse to said central longitudinal axis and wherein said ferrite rod has a substantially uniform cross sectional dimension along its length.

11. The power limiter as defined by claim 4 wherein an air spacing exists between the respective plurality of coupled dielectric resonators.

* * * * *